(12) United States Patent
Okada et al.

(10) Patent No.: US 6,794,030 B1
(45) Date of Patent: Sep. 21, 2004

(54) HEAT CONDUCTIVE SHEET AND METHOD OF PRODUCING THE SHEET

(75) Inventors: Mitsuhiko Okada, Kanagawa (JP); Tomoaki Uchiya, Kanagawa (JP)

(73) Assignee: 3M Innovative Properties Company, St. Paul, MN (US)

(*) Notice: Subject to any disclaimer, the term of this patent is extended or adjusted under 35 U.S.C. 154(b) by 0 days.

(21) Appl. No.: 09/719,893

(22) PCT Filed: Nov. 7, 2000

(86) PCT No.: PCT/US00/30614

§ 371 (c)(1),
(2), (4) Date: Dec. 19, 2000

(87) PCT Pub. No.: WO01/41213

PCT Pub. Date: Jun. 7, 2001

(30) Foreign Application Priority Data

Nov. 30, 1999 (JP) .......................... 11-340138

(51) Int. Cl.[7] .............................................. B32B 7/12
(52) U.S. Cl. .................. 428/343; 428/344; 428/355 N; 428/355 BL; 428/355 AC; 428/425.8; 428/450; 428/423.7; 428/424.8; 428/451; 428/516; 428/698
(58) Field of Search ................................ 428/343, 344, 428/355 N, 355 BL, 355 AC, 425.8, 450, 423.7, 424.8, 451, 516, 698, 461, 447; 427/490, 492

(56) References Cited

U.S. PATENT DOCUMENTS

| | | | | |
|---|---|---|---|---|
| 5,399,416 A | * | 3/1995 | Bujard | ........................ 361/712 |
| 5,741,579 A | | 4/1998 | Nishizawa | |
| 6,051,652 A | * | 4/2000 | Kawate et al. | ............... 525/119 |
| 6,159,588 A | * | 12/2000 | Eddy et al. | .................. 428/215 |

FOREIGN PATENT DOCUMENTS

| | | | | |
|---|---|---|---|---|
| CA | 2061093 | 8/1992 | | |
| EP | 0 499 585 | 8/1992 | | |
| EP | 0 528 606 | 2/1993 | | |
| EP | 0 790 762 | 8/1997 | | |
| EP | 0 928 027 | 7/1999 | | |
| JP | 56-837 | 1/1981 | | |
| JP | 6-291226 | 10/1994 | | |
| JP | 7-111300 | 4/1995 | | |
| JP | 7-157664 | 6/1995 | | |
| JP | 8-174765 | 7/1996 | | |
| JP | 9-17923 | 1/1997 | | |
| JP | 10-189838 | 7/1998 | | |
| JP | 10-204295 | 8/1998 | | |
| JP | 11033456 A | * | 2/1999 | ............. B05C/5/00 |
| WO | WO 96/37915 | 11/1996 | | |
| WO | WO 99/05722 | 2/1999 | | |
| WO | WO 99/59031 | * | 11/1999 | ............. G03F/7/12 |
| WO | WO 00/63968 | 10/2000 | | |

OTHER PUBLICATIONS

East, A; Golder, M.; Makhija, S. "Thermoplastic Polyesters" Kirk–Othmer Encyclopedia of Chemical Technology, John Wiley & Sons, Inc.: 1996; online posting date Dec. 4, 2000.*

(List continued on next page.)

Primary Examiner—James J. Seidleck
Assistant Examiner—Melanie Bissett
(74) Attorney, Agent, or Firm—Dean M. Harts

(57) ABSTRACT

The invention is directed toward a heat conductive sheet that has flexibility, can follow a specific shape such as ruggedness and curvature, which can therefore insure high adhesion and, at the same time, excellent heat releasing property, is free from the occurrence of wrinkle and rupture or elongation, even when the thickness is decreased, and is excellent in formability of sheet formation and in bonding work. Such heat conductive sheet includes a substrate and a heat conductive resin layer applied to at least one surface of the substrate, wherein the heat conductive resin layer is constituted as to contain a binder resin and a heat conductive filler dispersed in the binder resin.

13 Claims, 2 Drawing Sheets

OTHER PUBLICATIONS

Lieberman, R. "Polypropylene" Kirk–Othmer Encyclopedia of Chemical Technology, John Wiley & Sons, Inc.: 1996; online posting date Dec. 4, 2000.*

Sasaski, Tomiya, et al., "Development of Sheet Type Thermal Conductive Compound Using Ain," Proceedings of the (Japan) International Electronic Manufacturing Technology Symposium, U.S., New York, IEEE, Dec. 4, 1995, pp. 236–239, XP000686771.

Anonymous, "Filled Silicone Gel as a Thermal Transfer Medium in Electronic Packages," IBM Technical Disclosure Bulletin, vol. 30, No. 12, May 1, 1988, p. 146, XP002158633.

* cited by examiner

HEAT CONDUCTIVE SHEET AND METHOD OF PRODUCING THE SHEET

FIELD OF THE INVENTION

This invention relates to a heat conductive sheet and a production method thereof. More specifically, this invention relates to a heat conductive sheet, which is useful as a heat transfer medium of electronic components and so forth, and a production method thereof

BACKGROUND OF THE INVENTION

Dissipation of heat from heat generating members has become a problem in various fields. In a variety of devices, such as electronic devices, personal computers, and so forth, in particular, removal of heat from heat generating electronic components and other components (hereinafter generically referred to as the "heat generating components") incorporated in these devices has become a serious problem. The probability of erroneous operations of various heat generating components is likely to increase exponentially as the temperature of the components rises. Because these heat generating components have become smaller and smaller in size, and the processing speed has become higher and higher in recent years, the requirement for heat radiation performance has become all the more important.

Various heat radiation members such as a heat sink, a heat radiation fin, a metal heat radiation plate, etc. have been incorporated with heat generating components in order to dissipate the heat generated from, and built up in, the heat generating components. Also, various heat transfer sheets have been used as a heat transfer spacer and as a heat transfer medium between the heat generating components and the heat radiation member. A heat transfer spacer exhibiting high heat conductivity of at least 2.0 W/m·K and sufficiently reduced heat resistance in the packages has become necessary, particularly in recent years, in order to cope with remarkable exothermy resulting from a higher output operation of electronic devices.

Most of the conventional heat conductive sheets comprise the blend of a silicone rubber and a filler for improving heat conductivity. Examples of this filler are alumina, silica (quartz), boron nitride, magnesium oxide, and so forth. As a concrete example, Japanese Unexamined Patent Publication (Kokai) No. 56-837 describes a heat radiation sheet comprising an inorganic filler and a synthetic rubber such as a silicone rubber as the principal components, wherein the inorganic filler comprises two components of (A) boron nitride and (B) alumina, silica, magnesia, zinc white and mica. Japanese Unexamined Patent Publication (Kokai) No. 7-111300 describes an insulating, heat radiation sheet formed by causing boron nitride powder having a thickness of at least 1 μm to be co-present with a silicone rubber. Japanese Unexamined Patent Publication (Kokai) No. 7-157664 describes a heat conductive silicone rubber sheet that contains at least boron nitride and a ceramic material having the same crystal structure as that of boron nitride or a basic metal oxide in a silicone rubber, and is applied to a woven fabric. Furthermore, Japanese Unexamined Patent Publication Kokai) No. 10-204295 discloses a heat conductive silicone rubber composition useful for forming a sheet, which composition contains (A) a specific organopolysiloxane, (B) boron nitride powder, (C) a fluorine-modified silicone surfactant and (D) a curing agent.

Though these heat conductive silicone rubber sheets exhibit high heat conductivity, they involve several problems yet to be solved. For example, silicone rubber itself is expensive, and its cost is reflected in the cost of the heat radiation sheet. Because the sheet is fabricated by using silicone rubber having a low curing rate, the production process of the sheet is time-consuming Because large amounts of fillers are added in order to improve heat conductivity, a working machine is likely to be worn out with the increase of the viscosity. The production process of such a sheet is complicated, and the production apparatus includes an air heating furnace, a press machine, etc. and becomes large in scale.

The sheet itself of the conventional silicone rubber sheet is hard. Therefore, if the heat generation component or the heat radiation member has a specific shape, such as ruggedness or curvature, the sheet cannot follow such a shape, and the heat resistance increases due to the resulting gaps. If the rubber sheet is pushed strongly in order to eliminate such gaps, delicate electronic components are pushed excessively, and functional troubles are likely to occur.

Attempts have been made in recent years to make the silicone rubber softer so that the rubber sheet can acquire high adhesion capable of following the shapes of the components having complicated shapes. For example, Japanese Unexamined Patent Publication (Kokai) No. 10-189838 discloses a heat conductive gel useful for a heat radiation sheet, which gel is prepared by adding a silicone oil and a heat conductive filler such as boron nitride, silicon nitride, aluminum nitride, magnesium oxide, or the like, by using a condensation type gel such as a condensation curing type liquid silicone gel as a binder, and which is cured to the gel at a normal temperature. Though this heat radiation sheet can obtain high adhesion, however, its heat conductivity remains about 0.8 to 1.1 W/m*K. Therefore, the heat conductivity must be further improved in order to satisfy the recent requirement. If the packing ratio of the filler is increased to obtain higher heat conductivity, plasticity of the gel composition drops and the forming property gets deteriorated. Furthermore, the strength of the heat radiation sheet obtained after curing drops too. Even if the combination of the two kinds of inorganic fillers (A) and (B) described in the aforementioned Japanese Unexamined Patent Publication (Kokai) No. 56-837 is added to the silicone gel, the highest packing ratio that allows sheet forming is at most 45%, and a heat conductive sheet satisfying both requirements for high adhesion and high heat conductivity cannot be acquired.

In addition, another problem is caused if the silicone rubber or other heat conductive sheets are made to be softer. In other words, the heat conductive sheet is offered generally under the state where its tacky surface is covered with a release liner (release paper), and the release liner is peeled immediately before using the sheet. As the sheet thickness becomes smaller to satisfy the requirement for higher heat radiation performance, the heat conductive sheet is likely to get elongated when it is peeled from the release liner, and, when the liner is peeled after bonding, bonding of the sheet in a desired shape becomes difficult As a means for solving the problem of elongation of the heat conductive sheet it has been customary to use the heat conductive sheet under the state where it is supported by a support such as a plastic film, a metal foil, or the like. For example, Japanese Unexamined Patent Publication (Kokai) No. 6-291226 describes a heat radiation sheet having the feature in that a cured product of a silicone resin composition containing a heat conductive material is applied to one, or both, of the surfaces of a metal foil (foil of aluminum, copper, silver, etc.) having preferably a thickness of 0.01 to 0.05 mm. Japanese Unexamined Patent Publication (Kokai) No. 9-17923 describes a heat conductive sheet characterized by including a silicone gel layer on both surfaces of a support of an aluminum foil, or the like, having preferably a thickness of 0.025 to 0.10 mm. The metal foil used as the support is excellent in heat conductivity. However, because the thickness of the support is 0.02 mm or more, the foil lacks flexibility. When the support is the outermost layer and is in direct contact with the surface of the heat generating component or the surface of the heat radiation member, however, the foil fails to sufficiently follow the surface shape, and desired heat radiation performance cannot be obtained.

Japanese Unexamined Patent Publication (Kokai) No. 8-174765 discloses a heat-resistant heat conductive silicone rubber composite sheet obtained by curing a silicone rubber composition consisting of organopolysiloxane, carbon black and a curing agent on a heat-resistant resin film having a thickness of 5 to 300 μm and a glass transition point of not lower than 200° C. Preferred examples of the heat-resistant film used in this reference as the support are a polyimnide film and a polyamide film. Such supports are superior in flexibility to the metal foil described above. However, because heat conductivity is still low, there remains the problem that the heat resistance in the thickness-wise direction of the sheet remarkably increases.

If the thickness of the metal foil or the plastic film as the support is decreased to reduce the heat resistance in the thickness-wise direction of the heat conductive sheet, wrinkles are likely to occur in the support, or the support is ruptured or elongated, when the sheet is formed. For these reasons, it is difficult to manufacture heat conductive sheet products with high yield, that is, economically, in the practical production process.

Besides the beat conductive sheets described above, International Publication No. WO96/37915 describes an electronic circuit assembly including (a) a heat sink (b) an electronic circuit, and (c) an insulation layer interposed between the heat sink and the electronic circuit, wherein the insulation layer comprises (i) a first heat conductive adhesive layer keeping contact with the heat sink, consisting of an adhesive and heat conductive solid particles, and having a thickness of less than 60 μm, (ii) a heat resistant resin layer having a thickness of less than at most 15 μm and not containing a filler, and (iii) a second heat conductive adhesive layer keeping contact with the electronic circuit, consisting of an adhesive and heat conductive solid particles and having a thickness of less than 60 μm. However, the insulation layer having the three layered structure and used hereby as the heat radiation sheet has a complicated structure, is not easy to produce, and cannot yet solve the problems with the prior art described above.

It is therefore an object of the present invention to provide a heat conductive sheet that solves a large number of problems of the prior art described above, has flexibility, can follow a specific shape such as ruggedness and curvature, which can therefore insure high adhesion and at the same time, high heat conductivity of at least 2.0 W/mK and thus sufficiently reduced heat resistance in the packages, is free from the occurrence of wrinkles and rupture even when its thickness is decreased, and is excellent in formability during the formation of the sheet and in the working factor of bonding. Another object of the present invention is to provide a method of producing such heat conductive sheet.

SUMMARY OF THE INVENTION

To accomplish the object described above, the present invention provides a heat conductive sheet including a substrate and a heat conductive resin layer applied to at least one surface of the substrate, wherein the heat conductive resin layer contains a binder resin and a heat conductive filler dispersed in the binder resin.

Further, according to the present invention, there is provided a method of producing a heat conductive sheet including a substrate and a heat conductive resin layer applied to at least one surface of said substrate, comprising the steps of:

supporting said substrate by a support;

applying a film-forming resin composition containing a binder resin and a heat conductive filler to a non-supporting surface of said substrate to form a heat conductive resin layer, and separating the resulting heat conductive sheet from said support

DETAILED DESCRIPTION OF THE INVENTION EMBODIMENTS

Figure 1:
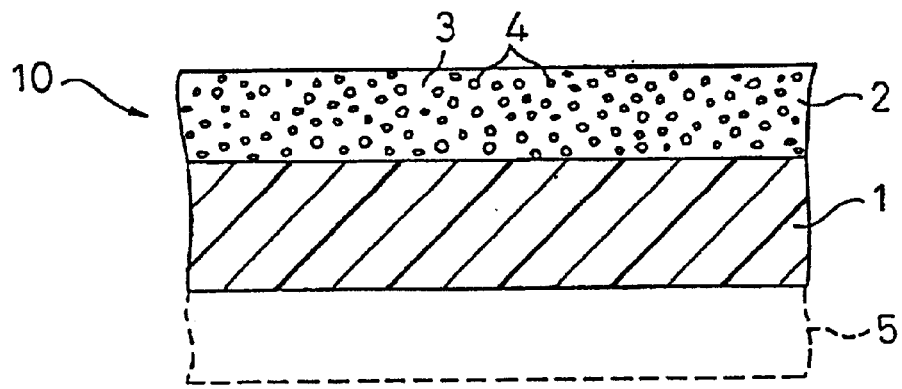
FIG. 1 is a sectional view showing a heat conductive sheet according to one preferred embodiment of the present invention.

As shown schematically in FIG. 1, a heat conductive sheet 10 according to the present invention includes a substrate 1 and a heat conductive resin layer 2 as the constituent elements. In this instance, the heat conductive resin layer 2 may be disposed on one surface of the substrate 1 as shown in FIG. 1. Alternatively, another heat conductive resin layer 5 may be disposed on the side opposite to the heat conductive resin layer 2 as indicated by a dotted line in FIG. 1. Whether the heat conductive resin layer 2 is disposed on one, or both, of the surfaces of the substrate 1 is determined arbitrarily depending on the application of the intended heat conductive sheet 10 and other factors. When handling property of the sheet is taken into account, the heat conductive resin layer 2 is generally, and preferably, disposed on only one surface of the substrate 1. In this case, the thickness of both of them is preferably as small as possible. The heat conductive resin layer 2 (and 5) assembled into the heat conductive sheet 10 of the present invention is constituted as to contain at least a binder resin 3 and a heat conductive filler 4 dispersed in the binder resin 3. Hereinafter, preferred embodiments of the present invention will be explained with reference to each of these constituent elements.

In the practice of the present invention, the heat conductive resin layer can be formed by using various binder resins, which are generally used as the binder or binding resins for producing the heat conductive sheet, as the main agent. The binder resins suitable as the main agent for forming the heat conductive resin layer are not always limited to the following example, but they are of a two-component type resin such as a silicone gel or a urethane resin, a synthetic rubber type resin, and a thermoplastic resin of an acrylic type. Among them, the two-component type silicone gel and the urethane resin can be used advantageously when the film formation of the heat conductive resin layer on the substrate and the film formation method employed thereby are taken into consideration.

Though the two-component type silicone gel and the urethane resin include a variety of resins, any two-component type resins can be used in the present invention so long as the resins do not contain volatile components, have sufficiently long pot life after mixing of the two components, and a practically long curing time, to such an extent as not to impede the production process, or it concretely speaking, from several minutes to several hours, for example, and moreover, so long as the resin after curing has sufficient softness. Among them, the silicone gel can be used most advantageously because it is soft over a broad temperature range and is excellent in heat resistance.

More concretely, the silicone gel comprises generally an organopolysiloxane having an alkenyl group and organopolysiloxane having a silicon-bonded hydrogen atom, and is commercially available as an addition reaction curing type silicone composition. Such a silicone composition is available in two types, i.e. one-component type and two component type. The one-component type silicone composition can provide a soft gel after being heated, and the two component type can provide a soft gel after being mixed and then heated. In the embodiments of the present invention, the two-component type silicone composition can be used specifically advantageously as described above.

The filler used in combination with the binder resin for forming the heat conductive resin layer is not particularly limited so long as it can provide the heat conductive resin layer having heat conductivity of a desired level when it is uniformly dispersed in the binder resin. Various materials used generally as the filler for producing the heat conductive sheet can be used in the present invention too. Though the appropriate filler is not limited particularly to the following fillers, inorganic materials typified by ceramic materials such as silicon carbide, boron nitride, aluminum oxide and aluminum nitride, can be used preferably. Such inorganic fillers can be used advantageously in the form of particles.

Though the particles of the inorganic fillers can be used individually, two or more kinds of the same or different kind of inorganic filler particles having mutually different particle diameters are preferably used in mixture and in combination. Among others, the combination in which one of the kinds of the filler particles is silicon carbide particles having a smaller specific area, or particles having a relatively large particle diameter, and the other kind of the filler particles is the boron nitride particles having a smaller particle diameter than the silicon carbide particles, satisfies both heat conductivity and economy, and can be used most advantageously. The silicon carbide particles having mutually different particle diameters may be used naturally, whenever required, or only the boron nitride particles having mutually different particle diameters may be used as well. Incidentally, the term "particle" used in this specification has a broad meaning, and therefore includes so-called "powder," "particulate form," and so forth, beside the particles generally used.

The following explanation, which is merely representative but in no way restrictive, is directed to having the present invention further easily understood. The following remarkable effects can be obtained when the binder resin is the silicone gel and the inorganic filler dispersed in the gel is the combination of the silicon carbide particles having a large particle diameter and the boron nitride particles having a small particle diameter.

When the two kinds of filler particles are used in combination and their blend ratio is controlled, the characteristics of the respective particles can be sufficiently exploited. Consequently, heat conductivity can be improved and formability during sheet formation can be improved without spoiling softness of the silicone gel. In practice, the heat conductive sheet obtained in this way can exhibit by far excellent softness in comparison with the conventional silicone rubber heat conductive sheets. When these two kinds of particles are dispersed in the silicone gel, the large silicon carbide particles are distributed in such a fashion as to define gaps, and the small boron nitride particles fill these gaps and provide a compact structure. From this aspect, too, these particles greatly contribute to the improvement of heat conductivity and other effects.

The silicon carbide particle as the first filler has been used as the filler in the conventional silicone rubber heat conductive sheet too. Generally, the silicon carbide particles of the type, that have been used as a polishing agent in the industrial field, can be used advantageously in the present invention. The shape of the silicon carbide particles is not limited, in particular, and the particles may be spherical or flat, sheet-like particles. The size of the silicon carbide particles can be varied over a broad range in accordance with the desired effect and with the size of the boron carbide particles used simultaneously. However, it is generally, and preferably, within the range of 1 to 200 $\mu$m, and more preferably within the range of 10 to 180 $\mu$m Since the silicon carbide particle has an extremely smaller specific surface area than other filler particles, the packing density of the filler particles can be increased to the maximum level and heat conductivity can be improved remarkably when it is combined with the boron carbide particle, as explained already.

The boron carbide particle as the second filler, too, has been used as the filler in the conventional silicone rubber heat conductive sheets. Though the boron carbide particle includes various types of particles, the boron carbide particle of the hexagonal system is used generally, and preferably, from the aspect of excellent heat conductivity. The shape of the boron carbide particle is not limited, in particular, and may be spherical or flat, sheet-like. The size of the boron carbide particle can be changed over a broad range in accordance with the desired effect and with the size of the silicon carbide particle that is used simultaneously. However, it is preferably within the range of 1 to 200 $\mu$m and more preferably 10 to 100 $\mu$m. For example, when the size of the silicon carbide particle is 50 $\mu$m, the size of the boron carbide particle used simultaneously is not greater than 50 $\mu$m. For example, it is preferably at least 10 $\mu$m and less than 50 $\mu$m. Incidentally, the term "Particle diameter" used herein is a mean value, and particles, a part of which falls off from the predetermined range of the size, may be used in the present invention because the particle diameter includes variance in nature.

The mixing ratio of the silicon carbide particle and the boron carbide particle in such composite filler particles can be changed broadly in accordance with the desired effect. Generally, 100 to 800 parts by volume of the silicon carbide particles are preferably added to 100 parts by volume of the boron nitride particles. More preferably, 150 to 700 parts by volume of the silicon carbide particles are added to 100 parts by volume of the boron nitride particles. If the mixing amount of the silicon carbide particles is below 100 parts by volume, the specific surface area of the mixed filler particles increases, so that the highest packing ratio of the filler to the silicone gel drops and sufficient heat conductivity cannot be obtained. If the mixing amount of the silicon carbide particles exceed 800 parts by volume, on the contrary, sufficient heat conductivity cannot be obtained because the mixing ratio of the boron nitride particles having high heat conductivity becomes small.

In the embodiment of the present invention, mixing of the heat conductive fillers to the silicone gel and other binder resins can be changed variously in accordance with the desired effect. Generally, the mixing ratio of the binder resin and the fillers is preferably 90 to 150 parts by volume of the fillers to 100 parts by volume of the binder resin. More preferably, 100 to 140 parts by volume of the fillers are added to 100 parts by volume of the binder resin. If the mixing amount of the fillers is below 90 parts by volume, heat conductivity becomes excessively low and if it exceeds 140 parts by volume, on the contrary, mixing of the binder resin and the fillers and formation of the heat conductive sheet become extremely difficult. Moreover, the resulting sheet becomes extremely brittle and cannot be used practically.

The heat conductive resin layer may contain optional additives, if necessary, in addition to the binder resin and the heat conductive filler described above. Suitable additives include a surfactant, a flame-retardant, a whisker, a fibrous filler, and so forth.

The heat conductive resin layer can be formed to a predetermined thickness by a conventional film formation methods such as coating, sheet forming, and so forth. Sheet forming can be used particularly advantageously as will be explained next concretely. In other words, the constituent components of the layers described above are kneaded either simultaneously or step-wise in an arbitrary sequence, and the resulting mixture, that is, the film-forming resin composition, preferably a heat conductive compound, is formed into the sheet on the substrate by a sheet forming machine. In this sheet forming operation, the film-forming resin composition is applied to the surface of the substrate preferably under the state where the substrate is kept supported on a support The heat conductive resin layer formed in this way may have various thicknesses depending on the object of use of the heat conductive sheet or on the position of application. However, the heat conductive resin layer is preferably as thin as possible, and has generally, and preferably, a thickness within the range of 0.05 to 6.0 mm, preferably within the range of 0.10 to 2.5 mm. If the thickness of the heat conductive resin layer is less than 0.05 mm, air is likely to be entrapped between the exothermic components and the heat radiation members and, eventually, sufficient heat radiation performance cannot be obtained. If the thickness exceeds 6.0 mm, on the contrary, the heat resistance of the sheet becomes so great that heat radiation performance is lost.

The substrate for supporting the heat conductive layer is not particularly limited so long as it satisfies the object of the present invention, but is preferably a plastic film, a metal foil or a single spread adhesive film. The optimum substrate can be selected and used depending on the formation method of the heat conductive sheet the object of its use, the application portion, and so forth. Although such a substrate is generally used as a single layer substrate, it may be a laminate structure of two or more layers.

For example, the plastic film useful as the substrate is a polyolefin film. It has high heat conductivity and weatherability, and a film having relatively high substrate strength can be advantageously used. Suitable examples of the polyolefin film include a polyethylene film, a polypropylene film, an EVA film, an EAA film and an ionomer film, though they are not restrictive examples. Among these polyolefin films, a highly crystalline and high density polyethylene and ultra-high molecular weight polyethylene films can be used most appropriately because they are excellent in strength and have relatively high heat conductivity even when they are thin. The thickness of such a polyolefin film can be changed broadly depending on various factors, but is as small as possible. Generally, the film thickness is within the range of 1 to 25 $\mu$m. If the thickness is below 1 $\mu$m, it becomes difficult to form a thin film devoid of defects even when it is applied and laminated onto the substrate even when the film-forming resin composition is supported by the support and is applied to the substrate. If the thickness of the film exceeds 25 $\mu$m, on the other hand, the heat resistance in the thickness-wise direction of the sheet becomes great, and heat radiation performance drops. When the film-forming resin composition is sandwiched between two mold release films and the resulting laminate is passed through two rolls, or is rolled by a press machine, as in the case of the formation of the ordinary films, the thin polyolefin film involves the possibility of the occurrence of wrinkles and rupture or elongation, as described already. However, the present invention can eliminate this possibility by laminating, in advance, the film on the substrate supported by the support before the resin composition is formed into the sheet This also holds true in the case when the metal foil, the single spread adhesive film, or the like, is used as the substrate in place of the plastic film, as will be explained below concretely.

The metal foil useful as the substrate is the foil of various metals such as aluminum, copper, gold, silver, lead, stainless steel, and so forth. Here, the term "foil" represents generally thin materials, and includes so-called "metal sheets" and "metal foils". Though the thickness of the metal foil can be changed broadly in accordance with various factors, the thickness is preferably as small as possible in the same way as the plastic film described above, and is generally and preferably within the range of 1 to 20 $\mu$m. If the thickness of the metal foil is smaller than 1 $\mu$m, the bonding work of the foil to the support becomes difficult, and if the thickness of the metal foil exceeds 20 $\mu$m, on the contrary, softness of the substrate drops and the follow-up property drops, too.

In the practice of the present invention, the single spread adhesive tape can be used as the substrate, too. Having the adhesive layer on one surface thereof the film allows the efficient bonding work when the substrate is bonded to the support. The most appropriate single spread adhesive film may be selected from among those films that are commercially available. The thickness of the single spread adhesive film is generally, and preferably, within the range of 1 to 25 $\mu$m in the same way as in the case of the polyolefin films described above.

The heat conductive sheet according to the present invention can be produced by placing and fixing in advance the substrate onto a suitable support, and forming the heat conductive resin layer on the surface of the substrate under such a state. The production method employed hereby can be changed variously within the scope of the present invention, but basically includes the following steps.

(1) a step to support the substrate by the support;

(2) a step to apply the film-forming resin composition containing the binder resin and the heat conductive filler, preferably the heat conductive compound, to the non-supporting surface of the substrate, that is, the surface opposite to the surface supported by the support, and to form the heat conductive resin layer, and (3) a step to separate the resulting heat conductive sheet from the support The support used herein for supporting the substrate is not limited, in particular, but is preferably a film made of a material excellent in heat resistance, strength and dimensional stability. Such a support film is specifically preferably the film made of the same material and having substantially the same thickness as the release film (cover film) used in combination during rolling to form the heat conductive sheet. One suitable example of the support film is a biaxially oriented polyester film.

The production method of the heat conductive sheet will be explained further concretely. Firm a predetermined amount of the filler particles are prepared, and are mixed with the undiluted solution of the silicone gel that is prepared separately. In this mixing operation, the mixture is sufficiently kneaded until the filler particles are uniformly dispersed and kneaded in the silicone gel. Because the viscosity of the mixture becomes extremely high, a kneading machine such as a kneader or a planetary mixture is used appropriately.

Next, the resulting mixture is applied to a suitable substrate and is formed into the sheet on this substrate. It is preferred in the present invention to support the substrate by the support prior to this forming work. The step of supporting the substrate by the support can be generally carried out by laminating the substrate on the support Such a lamination method includes a method that applies the adhesive to the surface of the support using a gravure coater and then bonds the substrate onto the support, a method that bonds the substrate to a re-peelable adhesive tape with low adhesion power such as a surface protection adhesive tape having the adhesive applied thereto beforehand, a method that directly applies the substrate-forming composition, such as a polyolefin resin, to the surface of the support, and then cures it, and so fort, though these methods are merely illustrative and in no way restrictive.

When the biaxially oriented polyester film is used as the support to laminate the substrate on the support and when the high density polyethylene film is used as the substrate, a re-peelable acrylic adhesive having high bonding power to the polyester film can be used appropriately as the adhesive for bonding the support and the substrate. When it is desired to obtain a heat conductive sheet having high bonding power as the final product, it is preferred to use a release film subjected to the release treatment (preferably, silicone treatment) for the support and an adhesive having particularly high bonding power as the adhesive.

A primer treatment may be further applied to the surface of the substrate after bonded to the support, if necessary, in order to improve adhesion of the heat conductive resin layer. When the substrate is the plastic film such as the polyolefin film, surface treatment such as corona discharge treatment may be conducted. When silicone gel is used as the binder resin, a primer such as the silicone type adhesive may be applied to the surface of the substrate.

After the substrate is laminated on the support, the laminate of the support, the substrate and the sheet-forming mixture is subjected to the sheet forming work It is preferred to apply in advance the mold release film (cover film) to the surface of this laminate. The forming work of the sheet using the mixture can be carried out, preferably by rolling. Various rolling methods are available. For example, the laminate is guided between two rolls and is subjected to calendar forming Alternatively, the laminate is rolled by a press machine. Finally, the resulting sheet is heated by a suitable heating means, giving the intended heat conductive silicone gel sheet (equipped with the substrate).

In the production process described above, the sequence of the addition of the starting materials and other steps can be changed arbitrarily so long as the change does not exert adverse influences on the resulting sheet.

Figure 2A:
FIG. 2 is a sectional view showing, step-wise, a production process of a heat conductive sheet according to one preferred embodiment of the present invention.
Figure 2B:
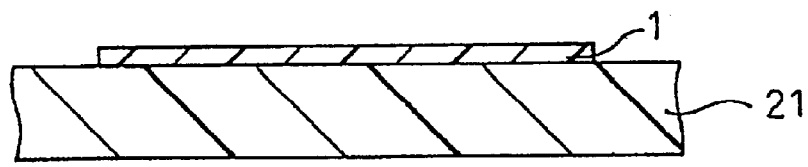
Figure 2C:
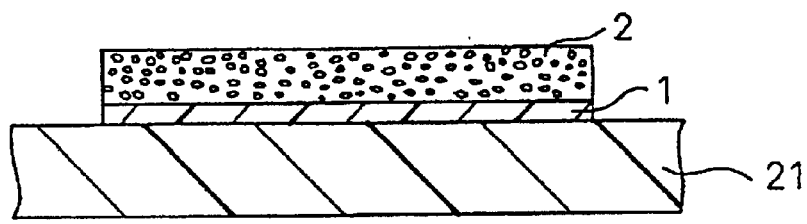

FIG. 2 shows the example where the plastic film or the metal foil is used as the substrate. First, the support 21 is prepared as shown in FIG. 2(A). The biaxially oriented polyester film, for example, can be used for the support. Next, as shown in FIG. 2(B), the selected substrate 1 is bonded to the surface of the support 21. The high density polyethylene film or the aluminum foil, for example, can be used for the substrate. Here, the support 21 and the substrate 1 can be bonded using a suitable adhesive such as an acrylic adhesive, though the adhesive is not necessary if the adhesive layer is applied to the surface of the support and/or the surface of the substrate used. After the bonding step is completed, the film-forming resin composition containing the binder resin and the heat conductive fillers, preferably the heat conductive compound, is applied to the substrate 1 bonded onto the support 21, as shown in FIG. 2(C), forming the beat conductive resin layer 2. Furthermore, a release liner (not shown) is applied. Subsequently, the laminate obtained by the process steps described above is passed through two rolls, or is rolled by the press machine to heat and cure the resin layer and to convert the laminate to the sheet. The sheet so obtained is separated from the support The heat conductive sheet having a small heat resistance in the thickness-wise direction can be obtained after a series of these process steps.

Figure 3A:
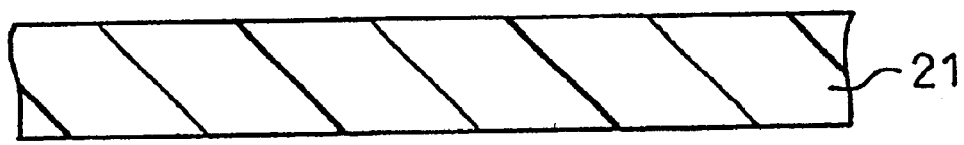
FIG. 3 is a sectional view showing, stepwise, a production process of a heat conductive sheet according to another preferred embodiment of the present invention.
Figure 3B:
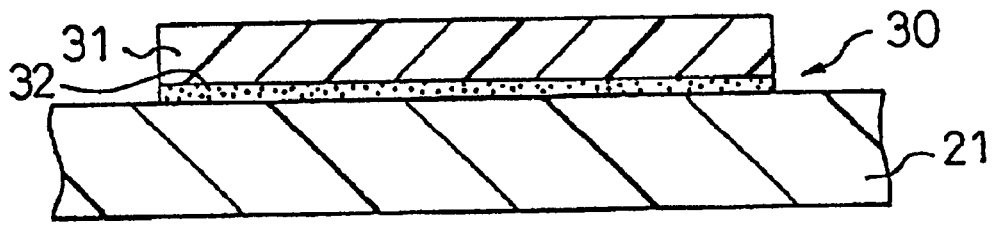
Figure 3C:
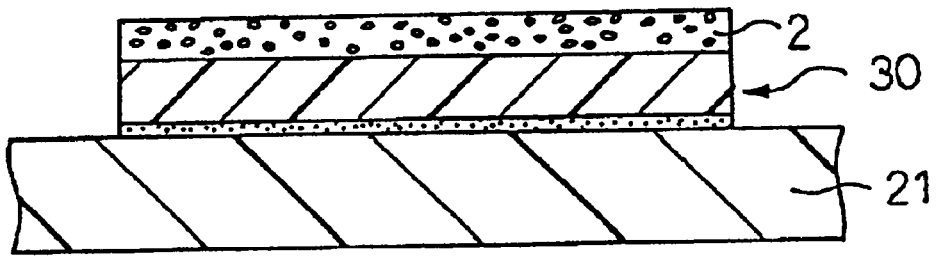

FIG. 3 shows the example where the single spread adhesive film is used as the substrate. First, the support 21 is prepared as shown in FIG. 3(A). The biaxially oriented polyester film, for example, can be used for the support, as described already. Next, as shown in FIG. 3(B), the selected single spread adhesive film 30 is bonded to the surface of the support 21. The polyester liner obtained by applying the adhesive layer 32 (such as the acrylic adhesive) to the surface of the polyester film 31, for example, can be used for the single spread adhesive film. Next, as shown in FIG. 3(C), the film-forming resin composition containing the binder resin and the heat conductive filler, preferably the heat conductive compound, is applied to the single spread adhesive film 30 bonded to the support 21, forming the heat conductive resin layer 2. Furthermore, the release liner (not shown) is laminated. Subsequently, the laminate obtained by these steps is passed between two rolls, or is rolled by the press machine, so as to heat and cure the resin layer and to convert the laminate to the sheet. The resulting heat conductive sheet is separated from the support. The heat conductive sheet having a small heat resistance in the thickness-wise direction can be obtained after a series of these 4 process steps.

The heat conductive sheet obtained in this way can generally exhibit high heat conductivity of 2.0 W/m·K or above. Such high heat conductivity results from the composition of the heat conductive resin composition inherent to the present invention as described above. The heat conductive sheet according to the present invention can acquire high heat conductivity of at least 2.0 to 2.6 W/m·K or above and, at the same time, it can exhibit an excellent heat releasing property as a result of remarkably reduced interracial heat resistance of the support.

The heat conductive sheet is supported by the substrate. Therefore, when the sheet is peeled from the liner for bonding to the exothermic component such as the electronic component, or when it is peeled from the component to correct the bonding position after it is once bonded, the work can be carried out without elongation of the sheet. Because a difference of bonding power can be imparted between both sides of the sheet, the sheet remains reliably bonded to the predetermined component when the component is separated for repair. Since the heat conductive sheet of this invention is by far superior in handling property to the heat conductive sheets without the substrate, the working factor can be drastically improved when the exothermic components are assembled. Since the heat conductive sheet of the present invention can also keep the small heat resistance in the thickness-wise direction, it is particularly effective for heat radiation application of the electronic components, or the like.

EXAMPLES

Hereinafter, the present invention will be explained with reference to Examples thereof. It is to be noted, however, that the invention is in no way limited to these examples. Incidentally, the term "parts" used hereinafter represents "parts by volumes" unless specified otherwise.

Example 1

A silicone gel raw material (Toray-Dow Corning "SE1886") was prepared, and 22.5 parts each of its A and B solutions were mixed to give a silicone gel. Next 13.75 parts of boron nitride particles (mean particle diameter =10 μm, "HP-1", a product of Mizushima Alloy K. K.) and 41.25 parts of silicon nitride particles (mean particle diameter =75 μm, "P#240", a product of Nanko Ceramics K. K.) were carefully and sufficiently mixed to prepare mixed filler particles. The resulting silicone gel and the mixed filler particles were charged into a planetary mixer and were sufficiently kneaded until a uniform dispersion of the filler particles could be observed with eye. There was, thus obtained, a film-forming resin composition in the slurry form.

A low tackiness adhesive film, Scotch™ polyester tape (75 μm-thick polyester film substrate, #5543, available from Minnesota Mining and Manufacturing Company) having re-peelability, was prepared as the support. After the release film was peeled from its adhesive surface, a 10 μm-thick high density polyethylene film (a product of Thermo Co.) was laminated on the adhesive surface so exposed. The slurry resin composition prepared above was put to the polyethylene film of the resulting laminate film. A 75 μm-thick polyester film (a product of Thermo Co.), having a cover film on the surface thereof that was subjected to peeling treatment, was laminated on the resin composition layer in such a fashion that the peel-treated surface of the cover film came into contact with the resin composition layer. The resulting laminate was subjected to calendar molding between two rolls and was heated at 120° C. for 10 minutes so as to cure the slurry composition to the gel. After this curing treatment was completed, the re-peelable single spread adhesive film that was used as the support and the polyester film used as the cover film were peeled. There was, thus obtained, a 0.5 mm-thick heat conductive sheet having the construction in which the high density polyethylene film was laminated on the surface of the heat conductive silicone gel layer containing the silicon nitride particles and the boron nitride particles, which were uniformly dispersed in the silicon gel, and which had high softness and flexibility.

An Evaluation Test was carried out in the following way in order to evaluate flexibility, heat resistance and handling property of the resulting heat conductive sheet.

1. Evaluation of flexibility:

To evaluate flexibility of the heat conductive sheet, twenty sheets were laminated to a thickness of 10 mm. Next, Asker A hardness was measured using an Asker rubber hardness tester of Kobunshi Keiki K. K. In this example, the measurement value immediately after the hardness tester was pushed to the laminate sheet was employed as the hardness value (maximum value). The Asker A hardness of this heat conductive sheet was 10.

For reference, the Asker A hardness of the commercially available silicone rubber sheet (without substrate; "Thercon GR-b", a product of Fuji Kobunshi Kogyo K. K. ) was 80. In other words, it could be understood that the heat conductive sheet of this example had more excellent flexibility than the conventional silicone rubber sheet.

2. Evaluation of heat resistance:

To evaluate heat conductivity of the heat conductive sheet, the "heat resistance" of the sheet was measured. The heat conductive sheet was sandwiched between a CPU and an aluminum plate. After the sheet was pushed to the CPU at a predetermined pressure, a voltage of 7 V was applied to the CPU. Five minutes later, the temperature difference between the CPU and the aluminum plate was measured, and the heat resistance was calculated from the measurement value. The heat resistance of the heat conductive sheet of this example was 0. 098° C.·cm²/W.

For reference, the heat resistance of the commercially available silicone rubber sheet, "Thercon GR-b" described above was 0.078° C.·cm²W. In other words, it could be understood that the heat conductive sheet of this example had a heat resistance comparable to that of the conventional silicone rubber sheet.

3. Evaluation of handling property:

To evaluate the handling property of the heat conductive sheet, the heat conductive sheet was fined as a heat transfer sheet between an LSI chip and heat radiation fins in an LSI device. The heat conductive sheet could be fitted easily and reliably without any problems such as wrinkles, rupture, fitting mistakes, and so forth.

For reference, because the commercially available silicon rubber sheet, ("Thercon GR-b" described above, was devoid of the substrate, handling was difficult and the sheet underwent deformation when it was fitted to the LSI chip and the heat radiation fins.

Example 2

The procedures of Example 1 were repeated by using a 7 μm-thick aluminum foil (produced by Sumikei Alumi-Foil K. K. ) as the substrate in place of the high density polyethylene film. Flexibility, heat resistance and handling property of the resulting heat conductive sheet were evaluated in the same way as in Example 1 with the evaluation results tabulated below.

| | |
|---|---|
| Asker A hardness: | 7 |
| heat resistance: | 0.096° C. · cm²/W |
| handling property: | fair |

Example 3

The procedures of Example 1 were repeated by using a 12 μm-thick aluminum foil (produced by Sumikei Alumi-Foil K. K. ) as the substrate in place of the high density polyethylene film. Flexibility, heat resistance and handling property of the resulting heat conductive sheet were evaluated in the same way as in Example 1 with the evaluation results tabulated below.

| | |
|---|---|
| Asker A hardness: | 10 |
| heat resistance: | 0.093° C. · cm²/W |
| handling property: | fair |

Example 4

The procedures of Example 1 were repeated by using a 6 μm-thick polyester film ("Tetron", a product of Teijin Co.) as the substrate in place of the high density polyethylene film. Flexibility, heat resistance and handling property of the resulting heat conductive sheet were evaluated in the same way as in Example 1 with the evaluation results tabulated below.

| | |
|---|---|
| Asker A hardness: | 10 |
| heat resistance: | 0.102° C. · cm²/W |
| handling property: | fair |

Example 5

A silicone gel raw material (Toray Dow Coming "SE1886") was prepared, and 22.5 parts each of its A and B solutions were mixed to give a silicone gel Next, 13.75 parts of boron nitride particles (mean particle diameter =10 μm, "HP-1", a product of Mizushima Alloy K. K. ) and 41.25 parts of silicon nitride particles K. K. (mean particle diameter =75 μm, "P#240", a product of Nanko Ceramics K. K.) were carefully and sufficiently mixed to prepare mixed filler particles. The resulting silicone gel and the mixed filler particles were charged into a planetary mixer and were sufficiently kneaded until a uniform dispersion of the filler particles could be observed with eye. There was, thus obtained, a film-forming resin composition in the slurry form.

Next, a simple-spread adhesive tape to be used as the substrate was produced. A mixture, prepared by adding and sufficiently mixing 3 parts by weight of a cross-linking agent ("M-5A", a product of Soken Kagaku K. K.) to 100 parts by weight of an acrylic adhesive ("SK-1501", a product of Soken Kagaku K. K.), was applied to a 50 μm-thick polyester release film ("Purex release film G50", a product of Teijin Co.) using a gravure roll; and the resulting coating was dried at 65° C. for 5 minutes. The thickness of the adhesive layer of the singic-spread adhesive tape after drying was 5 μm. A 7 μm-thick aluminum foil (a product of Sumikin Alumi Foil K. K. )was laminated on the exposed adhesive surface of the resulting simple-spread adhesive tape. The slurry-like resin composition prepared in the preceding step was applied to the aluminum foil of the resulting laminate film. A 75 μm-thick polyester film (a product of Thermo Co.), that had a cover film and underwent peeling treatment to the surface thereof, was laminated on the resin composition layer in such a fashion that the peel-treated surface of the cover film came into contact with the resin composition layer. The resulting laminate was calender-rolled between two rolls and heated at 120° C. for 10 minutes to cure the slurry to the gel. After this curing treatment, the polyester release film used as the support and the polyester film used as the cover film were peeled. There was, thus obtained, a 0.5 μm-thick heat conductive sheet having the construction in which the aluminum foil having the adhesive layer was laminated on the surface of the heat conductive silicone gel layer in which the silicon nitride particles and the boron nitride particles were uniformly dispersed and which was excellent in flexibility.

Flexibility, heat resistance and handling property of the resulting heat conductive sheet were evaluated in the same way as in Example 1 with the evaluation results tabulated below.

| Asker A hardness: | 10 |
| heat resistance: | 0.090° C. · cm²/W |
| handling property: | fair |

Comparative Example 1

The procedures of Example 1 were repeated by using a 18 μm-thick polyimide film ("Capton", a product of Toray-DuPont) as the substrate in place of the high density polyethylene film for the purpose of comparison. Flexibility, heat resistance and handling property of the resulting heat conductive sheet were evaluated in the same way as in Example 1 with the evaluation results tabulated below.

| Asker A hardness: | 80 |
| heat resistance: | 0.115° C. · cm²/W |
| handling property: | fair |

Comparative Example 2

The procedures of Example 1 were repeated using a 30 μm-thick high density polyethylene film (Thermo Co.) as the 3substrate in place of the high density polyethylene film for the purpose of comparison. Flexibility, heat resistance and handling property of the resulting heat conductive sheet were evaluated in the same way as in Example 1 with the evaluation results tabulated below.

| Asker A hardness: | 80 |
| heat resistance: | 0.112° C. · cm²/W |
| handling property: | fair |

Comparative Example 3

The procedures of Example 1 were repeated using as such the 10 μm-thick high density polyethylene film as the substrate, that is, under the state where it was not supported by the repeelable adhesive tape as the support, during the production of the heat conductive sheet. Flexibility, heat resistance and handling property of the resulting heat conductive sheet were evaluated in the same way as in Example 1, but none of the items could be measured. In other words, because calendar molding was carried out under the state where the substrate was not laminated on the support, the substrate was torn out during the molding process, and a heat conductive sheet that could be used sufficiently could not be obtained.

Table 1 below shows the evaluation results of Examples 1 to 5 and Comparative Examples 1 to 3.

TABLE 1

| Example No. | Asker A hardness | heat resistance (° C. · cm²/W) | handling |
|---|---|---|---|
| Ex. 1 | 10 | 0.098 | fair |
| Ex. 2 | 7 | 0.096 | fair |
| Ex. 3 | 10 | 0.093 | fair |
| Ex. 4 | 10 | 0.102 | fair |
| Ex. 5 | 10 | 0.090 | fair |
| Com.Ex. 1 | 80 | 0.115 | fair |
| Com.Ex. 2 | 80 | 0.112 | |
| Com.Ex. 3 | ---measurement was not possible--- | | |
| Reference* | 80 | 0.078 | inferior |

Reference*: commercially available silicone rubber sheet "Thercon GR-b" (trade name)

As can be understood from the evaluation results summarized in Table 1, all the heat conductive sheets according to the present invention had a small heat resistance in the thickness-wise direction because the substrate is appropriately thin or heat conductivity of the substrate is high, and have sufficient performance as the heat transfer sheet for electronic components. Because the heat conductive sheets have the substrate, their handling property is fair too.

As described above, the present invention can provide a heat conductive sheet that has flexibility, can follow a specific shape such as ruggedness and curvature, which can therefore insure high adhesion and, at the same time, excellent heat releasing property due to remarkably reduced interfacial heat resistance, is free from the occurrence of wrinkle and rupture or elongation, even when the thickness is decreased, and is excellent in formability in sheet formation and in bonding work.

Various modifications and alterations of the invention will become apparent to those skilled in the art without departing from the spirit and scope of the invention, which is defined by the accompanying claims. For example, it should be noted that steps recited in any method claims below do not necessarily need to perform in the order that they are recited. Those of ordinary skill in the art will recognize variations in performing the steps from the order in which they are recited. For example, in certain embodiments, steps may be performed simultaneously. The accompanying claims should be constructed with these principles in mind.

What is claimed is:

1. A heat conductive sheet including a substrate having a thickness from 1 to 7 $\mu$m and a self-supporting adhesive heat conductive resin layer applied to one surface of said substrate, wherein the heat conductive resin layer contains a binder resin and a heat conductive filler dispersed in said binder resin.

2. A heat conductive sheet according to claim 1, wherein said substrate comprises a plastic film, a metal foil or a single spread adhesive film.

3. A heat conductive sheet according to claim 1, wherein said substrate comprises a polyolefin film or a polyester film.

4. A heat conductive sheet according to claim 1, wherein said heat conductive resin layer is formed by applying a film-forming resin composition to the surface of said substrate under the state where said substrate is held on a support.

5. A heat conductive sheet according to claim 1, wherein said binder resin comprises at least one resin selected from a silicone gel resin, a urethane resin, a synthetic rubber resin, and an acrylic thermoplastic resin.

6. A heat conductive sheet according to claim 1, wherein said binder resin comprises at least one of a silicone gel resin and a urethane resin.

7. A heat conductive sheet according to claim 1, wherein said heat conductive filler comprises an inorganic filler.

8. A heat conductive sheet according to claim 1, wherein said heat conductive filler comprises two or more inorganic filler particles having mutually different particle diameters.

9. A heat conductive sheet according to claim 1, wherein said heat conductive filler comprises silicon carbide particles and boron nitride particles.

10. A heat conductive sheet according to claim 1, wherein said heat conductive resin layer is applied to only one surface of said substrate.

11. A heat conductive sheet according to claim 1, wherein said substrate comprises a plastic film having a thickness from 1 to 7 $\mu$m.

12. A heat conductive sheet according to claim 1, wherein said substrate comprises a metal foil having a thickness from 1 to 7 $\mu$m.

13. A heat conductive sheet according to claim 1, wherein said substrate comprises a single spread adhesive film having a thickness from 1 to 7 $\mu$m.

* * * * *